US009360539B2

(12) United States Patent
Carroll et al.

(10) Patent No.: US 9,360,539 B2
(45) Date of Patent: Jun. 7, 2016

(54) SYSTEM AND METHOD FOR PERFUSION AND DIFFUSION MR IMAGING (71) Applicants: Timothy J Carroll, Chicago, IL (US); Yong Jeong, Cary, IL (US); Sumeeth Vijay Jonathan, Manalapan, NJ (US); Parmede Vakil, Chicago, IL (US)

(72) Inventors: Timothy J Carroll, Chicago, IL (US); Yong Jeong, Cary, IL (US); Sumeeth Vijay Jonathan, Manalapan, NJ (US); Parmede Vakil, Chicago, IL (US)

(73) Assignee: National Institute of Health (NIH), U.S. Dept. Of Health and Human Services (DHHS), U.S. Government, Bethesda, MD (US)

(*) Notice: Subject to any disclaimer, the term of this patent is extended or adjusted under 35 U.S.C. 154(b) by 54 days.

(21) Appl. No.: 13/711,660

(22) Filed: Dec. 12, 2012

(65) Prior Publication Data
US 2014/0062477 A1    Mar. 6, 2014

Related U.S. Application Data (60) Provisional application No. 61/694,373, filed on Aug. 29, 2012.

(51) Int. Cl.
| *A61B 5/05* | (2006.01) |
| *G01R 33/34* | (2006.01) |
| *G01R 33/54* | (2006.01) |
| *G01R 33/48* | (2006.01) |
| *G01R 33/563* | (2006.01) |

(52) U.S. Cl.
CPC ............ *G01R 33/34* (2013.01); *G01R 33/4826* (2013.01); *G01R 33/54* (2013.01); *G01R 33/56341* (2013.01); *G01R 33/56366* (2013.01)

(58) Field of Classification Search
CPC .......... A61B 5/0008; A61B 5/01; A61B 8/08; A61B 8/488
USPC ............................ 600/410, 407; 324/360–309
See application file for complete search history.

(56) References Cited

U.S. PATENT DOCUMENTS

| 6,389,304 | B1* | 5/2002 | Van Den Brink et al. ..... 600/419 |
| 7,725,157 | B2  | 5/2010 | Dumoulin et al. |
| 7,904,135 | B2  | 3/2011 | Menezes et al. |
| 2004/0106864 | A1* | 6/2004 | Rose et al. ..................... 600/410 |
| 2007/0127794 | A1* | 6/2007 | Niogi et al. ................... 382/128 |
| 2007/0167727 | A1* | 7/2007 | Menezes et al. ............. 600/410 |
| 2008/0071167 | A1* | 3/2008 | Ikedo et al. ................... 600/419 |
| 2011/0234222 | A1* | 9/2011 | Frahm et al. .................. 324/309 |
| 2011/0254548 | A1* | 10/2011 | Setsompop et al. .......... 324/309 |

(Continued)

OTHER PUBLICATIONS

Chalela et al (Magnetic resonance perfusion imaging in Acute ischemic stroke using continuous arterial spin labeling, American heart association).*

(Continued)

*Primary Examiner* — Joel F Brutus
(74) *Attorney, Agent, or Firm* — Peter R. Withstandley (57) ABSTRACT A system for perfusion and diffusion MR imaging of a portion of patient anatomy includes an RF (Radio Frequency) signal generator for generating RF excitation pulses in anatomy and enabling subsequent acquisition of associated RF echo data. A magnetic field gradient generator generates anatomical volume select magnetic field gradients for phase encoding and readout RF data acquisition in a three dimensional (3D) anatomical volume. The RF signal generator and the gradient generator acquire within a single MR imaging scan, perfusion image data of the 3D volume, at least partially in the presence of contrast agent, and diffusion image data of the 3D volume.

18 Claims, 5 Drawing Sheets

(56) References Cited

U.S. PATENT DOCUMENTS

2012/0220858 A1  8/2012  Carroll et al.
2012/0283546 A1  11/2012 Zuehlsdorff et al.
2014/0037171 A1* 2/2014  Bhat et al. .................... 382/131

OTHER PUBLICATIONS

Wu et al (Predicting tissue outcome in acute human cerebral ischemia using combined diffusion and perfusion weighted MR imaging, 2001 American Heart association).*

* cited by examiner

SYSTEM AND METHOD FOR PERFUSION AND DIFFUSION MR IMAGING

CROSS-REFERENCE TO RELATED APPLICATIONS

This application is a non-provisional of, and claims priority to, U.S. provisional patent application Ser. No. 61/694,373 by T. J. Carroll et al. filed on 29 Aug. 2012.

This invention was made with government support under grant numbers 5R01HL088437-04 and 5T32EB005170-05 awarded by the National Institutes of Health. The government has certain rights in the invention.

FIELD OF THE INVENTION

This invention concerns a system for perfusion and diffusion MR imaging of a portion of patient anatomy, by acquiring, within a single MR imaging scan, perfusion image data of a 3D volume, at least partially in the presence of contrast agent, and diffusion image data of the 3D volume.

BACKGROUND OF THE INVENTION

Ischemic stroke is the third leading cause of death and disability in the industrialized world. Known systems perform magnetic resonance imaging (MRI) scans on a patient suffering from ischemic stroke to identify the degree of mismatch between volumes of dead and ischemic tissue using diffusion-weighted and perfusion-weighted MR images, respectively. The so-called ischemic penumbra is an important marker used to triage patients for endovascular therapy. Perfusion-diffusion mismatch is poorly standardized among imaging facilities, causing variability when used for stroke diagnosis. However, known systems lack capability to automatically evaluate the degree of perfusion-diffusion mismatch between MR images and additionally need to acquire perfusion-weighted and diffusion-weighted MR images separately, requiring an acquisition time of typically ten minutes or more. The known imaging protocols use different image acquisition parameters like spatial resolution and slice location between perfusion-weighted and diffusion-weighted MR images, requiring a specially trained technician to manually align and overlay the images in a process which may take up to an hour. A system according to invention principally addresses the need to minimize time between diagnosis and intervention in ischemic stroke and associated problems.

SUMMARY OF THE INVENTION

A system provides a non-invasive, diagnostic imaging examination concurrently acquiring perfusion-weighted and diffusion-weighted MR images for patients with acute ischemic stroke using a 3D-based MR pulse sequence with radial gradient trajectories, for example. A system for perfusion and diffusion MR imaging of a portion of patient anatomy includes an RF (Radio Frequency) signal generator for generating RF excitation pulses in anatomy and enabling subsequent acquisition of associated RF echo data. A magnetic field gradient generator generates anatomical volume select magnetic field gradients for phase encoding and readout RF data acquisition in a three dimensional (3D) anatomical volume. The RF signal generator and the gradient generator acquire within a single MR imaging scan, perfusion image data of the 3D volume, at least partially in the presence of contrast agent, and diffusion image data of the 3D volume.

BRIEF DESCRIPTION OF THE DRAWINGS

FIG. 2(a) shows an MR pulse sequence comprising perfusion-weighted imaging sequence and diffusion-weighted imaging sequence components.

FIG. 3(a) illustrates Echo-Planar MR signal readout in the superior-inferior plane.

DETAILED DESCRIPTION OF THE INVENTION

A system provides a non-invasive, diagnostic imaging examination concurrently acquiring perfusion-weighted and diffusion-weighted MR images for patients with acute ischemic stroke. In one embodiment, the examination uses a 3D-based MR pulse sequence with radial gradient trajectories that acquires high resolution perfusion-weighted and diffusion-weighted images of a brain and quantifies the ischemic penumbra (e.g. in less than two minutes). The system addresses the need to minimize time between diagnosis and intervention in stroke and other conditions using a single, comprehensive imaging examination that provides concurrent acquisition of perfusion-weighted and diffusion-weighted MR images to quantify ischemic penumbra, i.e. the residual viable neurons which are the target of intervention. The system performs a non-invasive, diagnostic imaging examination by concurrently acquiring perfusion-weighted and diffusion-weighted MR images for patients with acute ischemic stroke (e.g. in less than 2 minutes). The term concurrently as used herein is used in the context of concurrently acquiring both perfusion-weighted and diffusion-weighted MR image representative data within the time span of a single imaging scan. A single MR imaging scan is defined as acquisition of MR data using one or more pulse sequences, in response to user command and without further user intervention in imaging system operation throughout the scan. In one embodiment, a single examination uses a 3D-based MR pulse sequence with radial gradient trajectories that acquires high resolution perfusion-weighted and diffusion-weighted images of an entire brain and quantifies ischemic penumbra in less than two minutes.

The system quantifies ischemic penumbra in acute ischemic stroke using perfusion-diffusion mismatch and also quantifies cerebral perfusion and diffusion in central nervous system tumors, cerebrovascular occlusive disease, and Alzheimer's disease using a Bookend method, for example. The Bookend method is a magnetic resonance imaging (MRI) dynamic susceptibility contrast method that provides reliable quantitative measurement of cerebral blood flow (CBF) and cerebral blood volume (CBV). The quantification is patient specific, derived from a steady-state measurement of CBV and is obtained from T1 changes in the white matter and the blood pool after contrast agent injection. The system also performs abdominal perfusion and diffusion imaging for liver and kidney disease, spinal perfusion and diffusion imaging for Multiple Sclerosis and lower extremity perfusion and diffusion imaging in Peripheral Arterial Disease.

Figure 1:
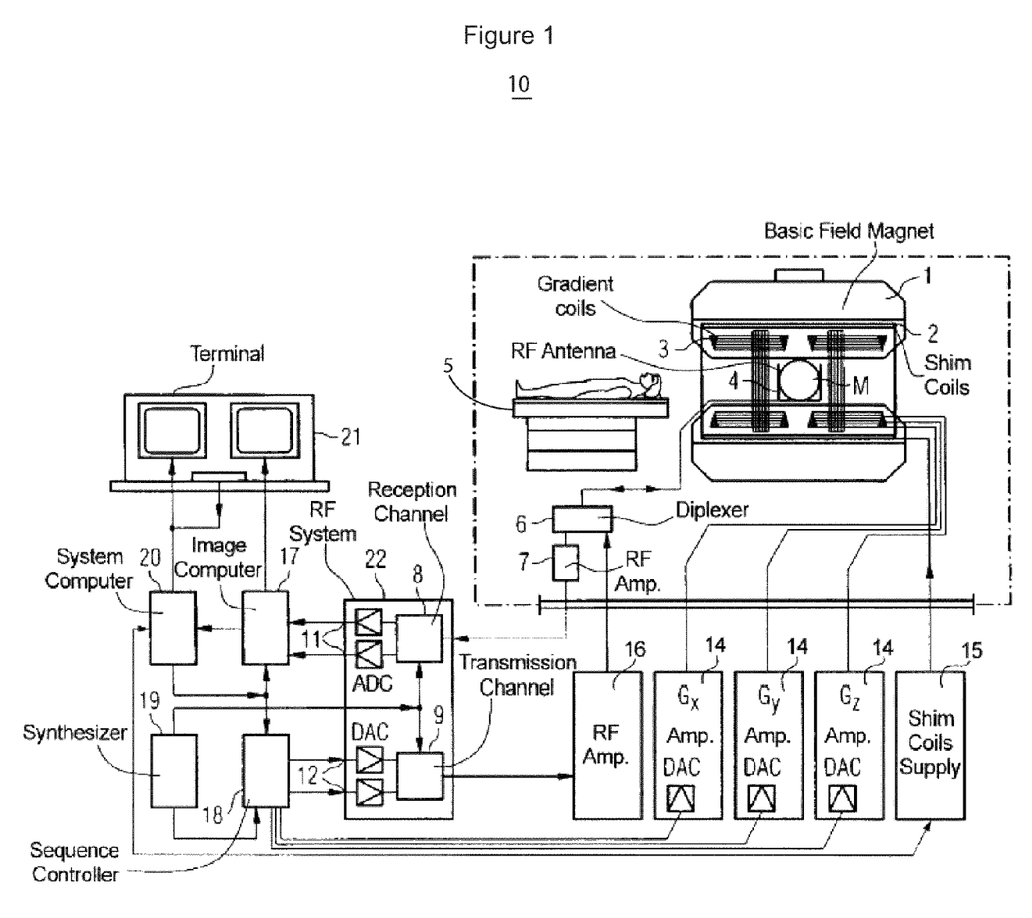
FIG. 1 shows a system for perfusion and diffusion MR imaging of a portion of patient anatomy, according to an embodiment of the invention.

FIG. 1 shows system 10 for perfusion and diffusion MR imaging of a portion of patient anatomy. In the basic field magnet 1, a cylinder-shaped gradient coil system comprising magnetic field gradient generator 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times. Homogeneity of the base magnetic field B0 is corrected using shim coils 2 electrically powered by shim coil supply 15.

Within the gradient field system 3, radio-frequency (RF) coils comprising RF (Radio Frequency) signal generator 4, are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. The RF (Radio Frequency) signal generator 4 generates RF excitation pulses in anatomy and enables subsequent acquisition of associated RF echo data. The magnetic field gradient generator 3 generates anatomical volume select magnetic field gradients for phase encoding and readout RF data acquisition in a three dimensional (3D) anatomical volume. RF signal generator 4 and gradient generator 3 within a single MR imaging scan, acquire perfusion image data of the 3D volume, at least partially in the presence of contrast agent, and diffusion image data of the 3D volume.

System 10 advantageously concurrently acquires perfusion-weighted and diffusion-weighted images using in one embodiment, a single MR pulse sequence that acquires perfusion-weighted and diffusion-weighted images with substantially identical sampling parameters to enable quantifying ischemic penumbra in less than two minutes. The system provides improved spatial resolution using an MR pulse sequence acquiring images using 3D volume excitations of a brain, including infratentorial and supratentorial regions. Signal-to-noise ratio (SNR) of acquired images is improved by the system 3D imaging. In known systems, images are typically acquired in a stack of 10-15 images with a spatial resolution of 5.0 mm by 1.2 mm by 1.2 mm (7.2 mm$^3$) using individual 2D excitations. In contrast, system 10 users a pulse sequence that acquires 64 images with a spatial resolution of 0.825 mm by 0.825 mm by 0.825 mm (0.561 mm$^3$) using 3D imaging to provide a signal to noise ratio (SNR) supporting a higher spatial resolution, for example.

System 10 improves anatomical coverage with a pulse sequence acquiring images using 3D volume excitations of an entire brain using an Echo-Planar MR signal readout in a superior-inferior plane. The acquisition of an MR signal in the superior-inferior plane provides improved coverage compared to traditional 2D-based MR pulse sequences, permitting perfusion-weighted and diffusion-weighted imaging of large structures like the spine. The system also improves accuracy of time-based imaging metrics by using a radial gradient trajectory in k-space with advantageous undersampling properties. Individual spokes of a radial MR data set contain an equal amount of low and high spatial frequencies, reducing the severity of undersampling artifacts and improving sensitivity to patient motion. An image data processor in imaging computer 17 of system 10 advantageously employs a pseudo-random ordered radial sampling method enabling sliding window image reconstruction, a view-sharing method that permits acquisition of images at 0.4 seconds per frame, improving the accuracy of time-based imaging metrics like time-to-maximum and time-to-peak of contrast agent flow. This is not possible with typical Cartesian gradient trajectories. A system 10 MR pulse sequence further reduces cortical blooming artifacts by providing increased coverage permitting the use of thinner slices and shorter echo times. In contrast, known perfusion-weighted MR imaging methods suffer from vessel blooming, an artifact of high arterial signal in gray matter regions in the brain which makes determination of cerebral perfusion unreliable in those areas.

Known systems acquire perfusion-weighted and diffusion-weighted MR images by rastering back and forth on a Cartesian grid through an excited 2D slice and incrementing slice position about every 100 milliseconds. In contrast, a system 10 pulse sequence samples k-space in 3D using radial spokes that bisect a head and rotate in the right-left/anterior-posterior plane, with an Echo-Planar MR signal readout in the superior-inferior plane. In addition, a diffusion-weighted MR pulse sequence is appended to the end of this perfusion-weighted pulse sequence. The diffusion-weighted sequence advantageously has substantially identical sampling parameters as the perfusion-weighted pulse sequence, with the exception of playing large motion-sensitizing diffusion gradients prior to signal readout to achieve diffusion weighting. The system performs Perfusion and Diffusion Mismatch MR Imaging of the Brain with Radial Acquisition (identifying ischemic penumbra).

Figure 2A:
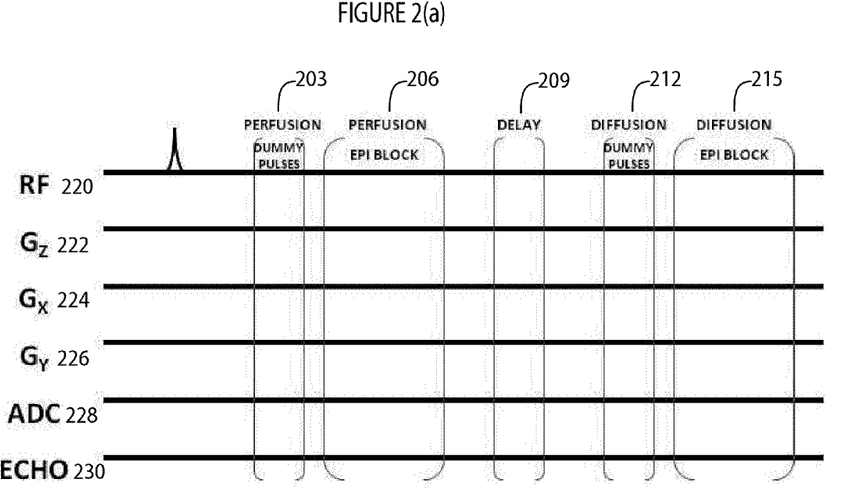
Figure 2B:
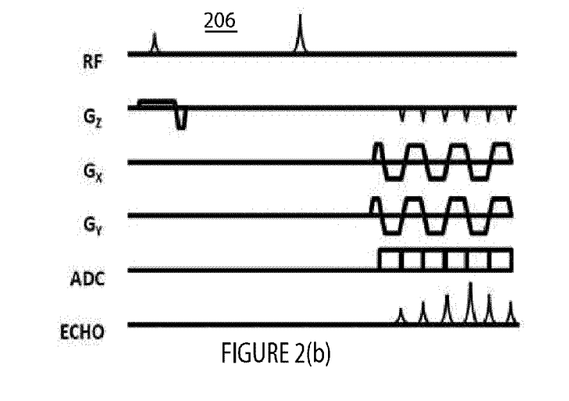
FIG. 2(b) shows a perfusion-weighted imaging sequence component and FIG. 2(c) shows a diffusion-weighted imaging sequence component, according to an embodiment of the invention.
Figure 2C:
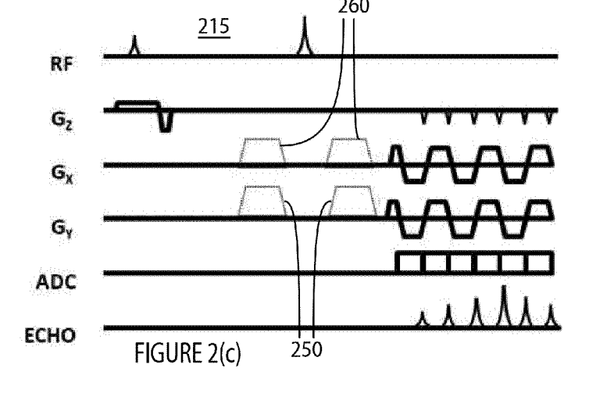

FIG. 2(a) shows an MR pulse sequence comprising perfusion-weighted imaging sequence and diffusion-weighted imaging sequence components used for radial 3D image acquisition, FIG. 2(b) shows a perfusion-weighted imaging sequence component 206 and FIG. 2(c) shows a diffusion-weighted imaging sequence component 215. The MR pulse sequence includes RF pulses 220, gradient field pulses Gx 224, Gy 226, Gz 222 respectively, analog to digital conversion pulses 228 and RF echo pulses 230 and comprises component segments 203, 206, 209, 212 and 215. Specifically, component segments comprise components including perfusion-weighted imaging sequence perfusion dummy pulses 203, perfusion-weighted imaging sequence component 206, delay 209, diffusion dummy pulses 212 and a diffusion-weighted imaging sequence component 215. FIG. 2(b) shows perfusion-weighted imaging sequence component 206 and FIG. 2(c) shows diffusion-weighted imaging sequence component 215. As illustrated, the FIG. 2(b) perfusion-weighted sequence 206 and FIG. 2(c) diffusion-weighted sequence 215 advantageously use substantially the same spatial frequency sampling with the exception that the diffusion-weighted sequence 215 plays large motion-sensitizing diffusion gradients 250 and 260 prior to signal readout to achieve diffusion weighting.

Perfusion-weighted imaging component 206, is advantageously performed before diffusion component 215 and achieves T2-contrast in neurovasculature by exciting a 3D volume with a 90-degree flip angle RF pulse and acquiring a center plane in the superior-inferior direction after an echo time (TE) of typically 30-40 milliseconds (FIG. 2(b)). Spin echoes in the superior-inferior plane are sampled using an Echo-Planar MR signal readout with bipolar gradient pulses. In total, 128 radial spokes, for example, are collected in 3D. The use of a T2-weighted spin echo acquisition enables the pulse sequence to accommodate additional diffusion weighting gradients without any loss of scan-time efficiency. Individual k-space radial spoke trajectories are sampled in a single repetition time (TR) in 49 milliseconds, for example, making the total acquisition time of a single perfusion-weighted volume 6.2 seconds. Perfusion-weighted imaging block 206 is performed for 14 repetitions for a total acquisition time of 88 seconds. Cerebral perfusion is measured by the injection of a contrast agent into the patient concerned during perfusion-weighted imaging block 206 comprising a dynamic susceptibility contrast MRI (DSC-MRI) method. As defined here, a contrast agent changes the magnetic susceptibility or longitudinal magnetization of neurovasculature. This change is reflected in an acquired MR signal over the 14 repetitions, for example.

Subsequently performed diffusion-weighted imaging component 215, uses substantially the same Echo-Planar MR signal readout method as perfusion-weighted imaging component 206 and in substantially the same superior-inferior direction, but achieves diffusion-weighting in the neurovasculature by exciting a 3D volume with large, motion-sensitizing trapezoidal gradients 250, 260 in the left-right, anterior-posterior, or superior-inferior directions prior to MR signal readout (FIG. 2(c)). A diffusion coefficient of 1000 is achieved using concatenated bipolar trapezoidal gradients 33 milliseconds in length. This extends the TE and TR of a single k-space radial trajectory spoke of the diffusion sequence to 82 and 97 milliseconds, respectively. The diffusion-weighted imaging block continues for 1 repetition for a total acquisition time of 13 seconds.

Following MR signal acquisition and reconstruction of perfusion-weighted and diffusion-weighted images, areas of decreased perfusion in the perfusion-weighted images and decreased diffusion in the diffusion-weighted images quantify ischemic stroke penumbra, which a physician may use to aid diagnosis and intervention of a patient with acute ischemic stroke. The co-registration is performed by identifying corresponding features in the images and aligning the images based on the identified corresponding features. System 10 advantageously eliminates the need to acquire perfusion-weighted and diffusion-weighted images using separate scans, and also eliminates the need for a specially trained technician to overlay images.

Figure 3A:
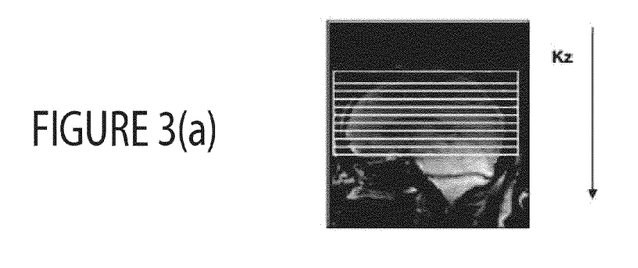
Figure 3B:
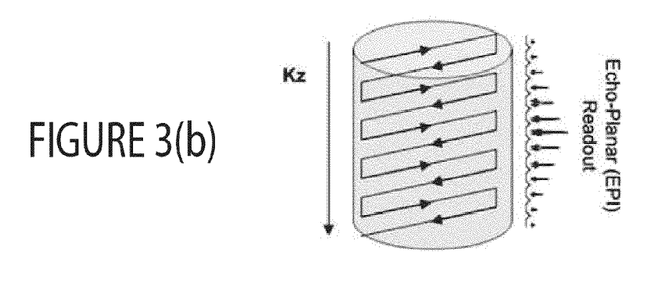
FIG. 3(b) illustrates a sampling method creating a 3D cylindrical stack-of-stars k-space and FIG. 3(c) illustrates Superior/Inferior Echo Planar signal acquisition combined with radial sampling in the Right-Left/Anterior-Posterior Plane, according to an embodiment of the invention.
Figure 3C:
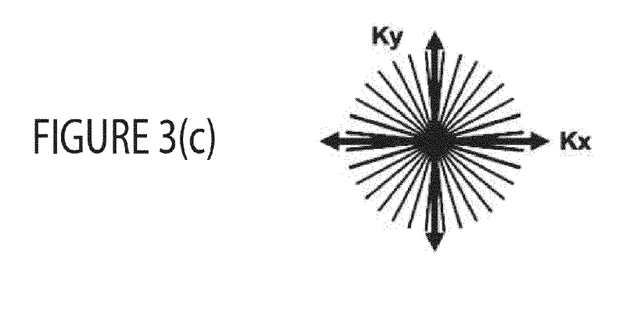

FIG. 3(a) illustrates Echo-Planar MR signal readout in the superior-inferior plane, FIG. 3(b) illustrates a sampling method creating a 3D cylindrical stack-of-stars k-space and FIG. 3(c) illustrates Superior/Inferior Echo Planar signal acquisition combined with radial sampling in the Right-Left/Anterior-Posterior Plane. The perfusion-weighted and diffusion-weighted image sequence uses a 3D volume excitation, and samples in 3D using k-space radial trajectory spokes that bisect the head and rotate in the right-left/anterior-posterior plane, with an Echo-Planar MR signal readout in the superior-inferior plane as shown in FIG. 3(a). This sampling method creates a 3D cylindrical stack-of-stars k-space as shown in FIG. 3(b) where Superior/Inferior Echo Planar signal acquisition (i.e. kz) is combined with radial sampling in the Right-Left/Anterior-Posterior Plane (i.e. kx-ky) as shown in FIG. 3(c).

Figure 4:
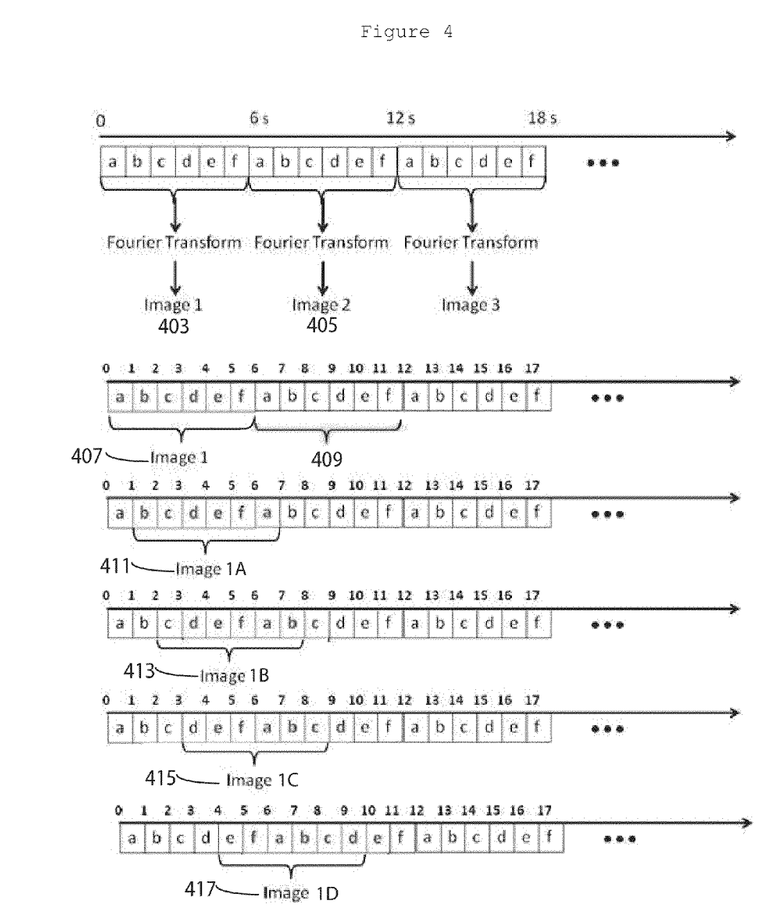
FIG. 4 shows sliding window image reconstruction used to accelerate image acquisition, according to an embodiment of the invention.

FIG. 4 shows sliding window image reconstruction used by system 10 to accelerate image acquisition. The image data processor in imaging computer 17 of system 10 performs sliding window image reconstruction, a view-sharing method that permits acquisition of images at 0.4 seconds per frame, for example, improving the accuracy of time-based imaging metrics like time-to-maximum and time-to-peak of contrast agent flow. The sliding-window reconstruction advantageously increases frame rate to 0.4 seconds per frame, for example. In sliding window reconstruction images are created which represent temporal changes in the image which occur between the time-points at which nominal MRI images are acquired using a view sharing method. For example, if an MRI machine acquires a brain image in 6 seconds, the time points for 5 successive images are 6, 12 18, 24 and 30 seconds. System 10 acquires these images as a bolus of contrast agent flushes through the brain, and uses the temporal change in signal to calculate capillary level blood flow, i.e. the tissue perfusion. The sampling rate of standard 3D Echo Planar acquisition is too slow to observe the 1-2 second temporal changes required for brain perfusion. The radial sliding window image reconstruction advantageously allows use of 3D-Echo Planar image acquisition and reconstruction of images at a rate amenable to post-processing analysis that produces images of cerebral perfusion.

A single image can be sub-divided into smaller sub-units, which make up the entire image. Each sub-unit or "segment" acquires less time to acquire than the whole of the image. These individual segments do not contain enough information to create a complete image, and are combined with an entire set of segments to make an image. In operation, two images 1 and 2 (403, 405) are acquired at time points 6 and 12 seconds. The data that goes into each of the images is made up of 6 distinct segments, a, b, c, d, e and f (407 and 409 respectively). Image 1 (403) is a combination of a, b, c, d, e and f (407) acquired consecutively over the first 6 seconds of the scan. The six segments of k-space are combined and subjected to a mathematical Fourier transformation in order to create an MRI image. The 6 second acquisition is followed by a second acquisition of a, b, c, d, e and f (409) which are combined and Fourier transformed to form a second image (405) representing the information acquired 12 seconds after the initiation of the scan, and so on.

If there is a change in the anatomy in the acquisition time intervals of images 1 and 2, this is reflected visually in the images (they look different). The influx of a bolus of contrast agent changes the luminance of the blood vessels and creates a shift in the bulk magnetic susceptibility of the brain in proportion to the volume of the blood contained in the capillaries. The two images 1 and 2 are separated in time by 6 seconds. However, the information that is used to make the images, the segments, a,b,c,d,e, and f, is acquired more rapidly, with a new segment being acquired each second. The image data processor performs sliding window image reconstruction that mixes the segments from two consecutively acquired images to create a new image frame. The new image frame contains information from images 1 and 2. If the segments are combined in the order in which they are acquired, the resulting images reflect the anatomy at a time intermediated between image 1 and 2. For example, the combination of segments 1d, 1e, 1f, 2a, 2b, 2c represents a sliding window image of the anatomy at a time point half way between original images 1 and 2 where image 1 comprises segment 1a, 1b, 1c, 1d, 1e, 1f and image 2 comprises segments 2a, 2b, 2c, 2d, 2e, 2f.

The image data processor generates multiple intermediate image frames successively one second later in time including, for example, Sliding Window Image 1 (407): 1a, 1b, 1c, 1d, 1e, 1f
Sliding Window Image 1A (411): 2a, 1b, 1c, 1d, 1e, 1f
Sliding Window Image 1B (413): 2a, 2b, 1c, 1d, 1e, 1f
Sliding Window Image 1C (415): 2a, 2b, 2c, 1d, 1e, 1f
Sliding Window Image 1D (417): 2a, 2b, 2c, There is a greater fraction of the original Image 2 with each successive image. The image update rate increases from one image every 6 seconds to one image every second. 2d, 1e, 1f MRI image formation and its use of Fourier transformation of k-space results in a preponderance of image information being contained in the so-called "low spatial frequencies" referred to by those skilled in the art as the "center" of k-space. Therefore sampling the center of k-space more often produces a time-resolved image with greater fidelity in its representation of images that change with time. For this reason, the combination of radial sampling of k-space, where the center, low spatial frequencies are sampled with each Echo Planar echo train and the sliding window reconstruction advantageously improves the rate at which 3D Echo Planar dynamic images are acquired.

Figure 5:
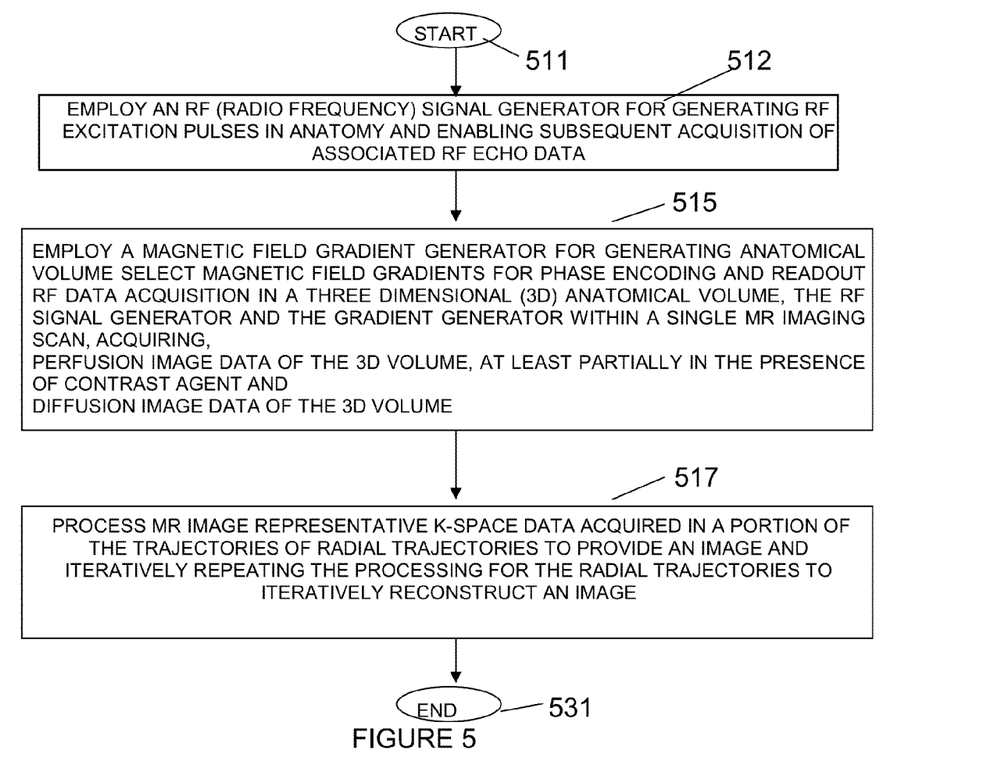
FIG. 5 shows a flowchart of a process performed by a system for perfusion and diffusion MR imaging of a portion of patient anatomy, according to an embodiment of the invention.

FIG. 5 shows a flowchart of a process performed by system 10 (FIG. 1) for perfusion and diffusion MR imaging of a portion of patient anatomy. In step 512 following the start at step 511, RF (Radio Frequency) signal generator (RF coils 4) generates RF excitation pulses in anatomy and enables subsequent acquisition of associated RF echo data. In step 515, magnetic field gradient generator 3 generates anatomical volume select magnetic field gradients for phase encoding and readout RF data acquisition in a three dimensional (3D) anatomical volume. The magnetic field gradient generator provides magnetic gradients for echo planar imaging readout RF data acquisition and provides trapezoidal magnetic field gradient pulses for diffusion image data acquisition preparation of the 3D volume. In other embodiments, the trapezoidal gradients may be sinusoidal or rectangular. RF signal generator 4 and gradient generator 3 within a single MR imaging scan, acquire perfusion image data of the 3D volume, at least partially in the presence of contrast agent, and diffusion image data of the 3D volume using substantially the same spatial sampling characteristics. The single MR imaging scan comprises acquisition of MR data using one or more pulse sequences, in response to user command and without further user intervention in imaging system operation throughout the scan. In one embodiment, the diffusion sensitizing gradients follow the angle of the radial projections and the spatial encoding gradients follow a radial trajectory. However, those skilled in the art recognize that the direction of the diffusion sensitizing gradients can be independent of the projection angle and maybe fixed in direction relative to the anatomy, while the radial projections change their angular orientation. The gradients can obtain diffusion of the sample along an arbitrary direction X, Y, Z, or even along a direction that is some combination of the three (X and Y, for example).

The spatial sampling characteristics, comprise, (a) slice thickness, (b) volume and (c) volume scan direction. The anatomical volume comprises a brain and the anatomical volume scan direction comprises at least one of, (a) anterior-posterior and (b) superior-inferior. Substantially the same spatial sampling characteristics are used to spatially co-register image data acquisition of the perfusion image data with image data acquisition of the diffusion image data. The RF signal generator and the gradient generator provide a pulse sequence for acquiring the perfusion image data in the single MR imaging scan through different slices of the 3D volume and along planar radial trajectories from the center of k-space. The pulse sequence is used for acquiring the diffusion image data in the single MR imaging scan through the same different slices of the 3D volume and along the same radial trajectories from the center of k-space and in one embodiment along planar radial trajectories from the center of k-space.

The pulse sequence is used for acquiring the diffusion image data in the single MR imaging scan through the same different slices of the 3D volume and along the same radial trajectories from the center of k-space in the same k-space element acquisition order. The radial trajectories comprise at least one of, (a) linear and (b) spiral, trajectories. An image data processor in step 517 processes MR image representative k-space data acquired in a portion of the trajectories of the radial trajectories to provide an image and iteratively repeats processing MR image representative k-space data for the radial trajectories to iteratively reconstruct an image. The process of FIG. 5 terminates at step 531.

Returning to FIG. 1, RF coils 4 emit RF pulses to excite nuclear proton spins in a patient on support table 5 in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via a radio-frequency amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

DEFINITIONS

EPI=Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

FA comprises flip angle, i.e., an RF flip angle. For an inversion pulse, FA=180 degrees.

A saturation pulse (or saturation recovery pulse) comprises an RF pulse, typically 90 degrees (or any odd multiple of 90 degrees). Some systems use a spoiler gradient after the RF pulse. In a particular type of partial saturation pulse sequence a preceding pulse leaves the spins in a state of saturation, so that recovery at the time of the next pulse has taken place from an initial condition of no magnetization.

Segmented data acquisition records the different parts of raw data space (the segments) in a periodic fashion by repeatedly playing out a pulse sequence comprising an inversion pulse sequence and MR data acquisition pulses and acquiring a different set of k-space lines during readout (acquisition).

B0 is the main static base MRI magnetic field.

B1 is the RF transmit coil field.

The system and processes of FIGS. 1-5 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system provides a non-invasive, diagnostic imaging examination concurrently acquiring both perfusion-weighted and diffusion-weighted MR image representative data within the time span of a single imaging scan using one or more pulse sequences, in response to user command and without further user intervention in imaging system operation throughout the scan. Further, the processes and applications may, in alternative embodiments, be located on one or more (e.g., distributed) processing devices on a network linking the units of FIG. 1. Any of the functions and steps provided in FIGS. 1-5 may be implemented in hardware, software or a combination of both. No claim element herein is to be construed under the provisions of 35 U.S.C. 112, sixth paragraph, unless the element is expressly recited using the phrase "means for."

What is claimed is:

1. A system for perfusion and diffusion MR imaging of a portion of patient anatomy, comprising:
   an RF (Radio Frequency) signal generator for generating RF 3D volume excitation pulses in said portion of patient anatomy and facilitating subsequent acquisition of associated RF echo data; and
   a magnetic field gradient generator for generating anatomical volume select magnetic field gradients for phase encoding and readout RF data acquisition in a three-dimensional anatomical volume,
   wherein said RF (Radio Frequency) signal generator and said magnetic field gradient generator are configured to concurrently acquire within a single pulse sequence:
      perfusion image data of the three-dimensional anatomical volume, at least partially in the presence of contrast agent, and
      diffusion image data of the three-dimensional anatomical volume;
   wherein the perfusion image data and the diffusion image data are acquired using substantially the same spatial frequency sampling.

2. The system according to claim 1, wherein
said perfusion image data and said diffusion image data are acquired using substantially same spatial sampling characteristics, said substantially same spatial sampling characteristics comprising: (a) slice thickness, (b) volume, and (c) volume scan direction.

3. The system according to claim 2, wherein
said three-dimensional anatomical volume comprises a brain, and
said volume scan direction comprises at least one of: (a) anterior-posterior and (b) superior-inferior.

4. The system according to claim 2, wherein
said substantially same spatial sampling characteristics are used to spatially co-register image data acquisition of said perfusion image data with image data acquisition of said diffusion image data.

5. The system according to claim 1, wherein
said magnetic field gradient generator is configured to provide magnetic gradients for echo planar imaging readout RF data acquisition.

6. The system according to claim 1, wherein
said magnetic field gradient generator provides trapezoidal magnetic field gradient pulses for diffusion image data acquisition preparation of said three-dimensional anatomical volume.

7. The system according to claim 1, wherein
said RF (Radio Frequency) signal generator and said magnetic field gradient generator provide a single pulse sequence configured to facilitate acquisition of said perfusion image data in said single pulse sequence through different slices of said three-dimensional anatomical volume and along planar radial trajectories from the center of k-space.

8. The system according to claim 7, wherein
said pulse sequence is further configured to facilitate acquisition of said diffusion image data in said single pulse sequence through said different slices of said three-dimensional anatomical volume and along said planar radial trajectories from the center of k-space.

9. The system according to claim 8, wherein
said diffusion image data is acquired in said single pulse sequence through said different slices of said three-dimensional anatomical volume and along said planar radial trajectories from the center of k-space in a same k-space element acquisition order.

10. The system according to claim 7, wherein
said planar radial trajectories comprise at least one of linear and spiral trajectories.

11. The system according to claim 7, including
an image data processor configured to:
   (i) process MR image representative k-space data acquired in a portion of said planar radial trajectories to provide an image, and
   (ii) iteratively repeat step (i) for said planar radial trajectories to iteratively reconstruct a further image.

12. The system according to claim 1, wherein
said single pulse sequence comprises acquisition of MR data using one pulse sequences, in response to user command and without further user intervention in imaging system operation throughout said single pulse sequence.

13. A system for perfusion and diffusion MR imaging of a portion of patient anatomy, comprising:
   an RF (Radio Frequency) signal generator for generating RF 3D volume excitation pulses in said portion of patient anatomy and facilitating subsequent acquisition of associated RF echo data; and
   a magnetic field gradient generator for generating anatomical volume select magnetic field gradients for phase encoding and readout RF data acquisition in a three-dimensional anatomical volume,
   wherein said RF (Radio Frequency) signal generator and said magnetic field gradient generator are configured to provide, within a single MR imaging scan, a single pulse sequence configured to facilitate acquisition using substantially the same spatial frequency sampling of perfusion image data and diffusion image data in said single MR imaging scan through different slices of said three-dimensional anatomical volume and along planar radial trajectories from the center of k-space.

14. The system according to claim 13, wherein
said diffusion image data is acquired in said single MR imaging scan through said different slices of said three-dimensional anatomical volume and along said planar radial trajectories from the center of k-space in a same k-space element acquisition order.

15. A method for perfusion and diffusion MR imaging of a portion of patient anatomy, comprising the activities of:
   employing an RF (Radio Frequency) signal generator for generating RF 3D volume excitation pulses in said portion of patient anatomy and enabling subsequent acquisition of associated RF echo data; and
   employing a magnetic field gradient generator for generating anatomical volume select magnetic field gradients for phase encoding and readout RF data acquisition in a three-dimensional anatomical volume, said RF signal generator and said magnetic field gradient generator configured to concurrently acquire within a single pulse sequence:
      perfusion image data of the three-dimensional anatomical volume, at least partially in the presence of contrast agent, and
      diffusion image data of the three-dimensional anatomical volume;

wherein the perfusion image data and diffusion image data are acquired using substantially the same spatial frequency sampling.

16. The method according to claim 15, wherein said perfusion image data and diffusion image data are acquired using substantially same spatial sampling characteristics, said substantially same spatial sampling characteristics comprising: (a) slice thickness, (b) volume, and (c) volume scan direction.

17. The method according to claim 16, wherein said three-dimensional anatomical volume comprises a brain, and
said volume scan direction comprises at least one of: (a) anterior-posterior, and (b) superior-inferior.

18. The method according to claim 16, wherein said substantially same spatial sampling characteristics are used to spatially co-register image data acquisition of said perfusion image data with image data acquisition of said diffusion image data.

* * * * *